US012160234B2

(12) United States Patent
Faber et al.

(10) Patent No.: US 12,160,234 B2
(45) Date of Patent: Dec. 3, 2024

(54) DEVICE AND METHOD FOR DETECTING A HAND GRASP WITH A TWO-ZONE SENSOR IN THE STEERING WHEEL

(71) Applicant: IEE INTERNATIONAL ELECTRONICS & ENGINEERING S.A., Echternach (LU)

(72) Inventors: Thomas Faber, Schweich (DE); Gianluca Favalli, Aubange (BE); Baptiste Anti, Hettange-Grande (FR); Valentin Catalin Mica, Lintgen (LU); Miguel Ribeiro, Remich (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 331 days.

(21) Appl. No.: 17/626,095

(22) PCT Filed: Jul. 8, 2020

(86) PCT No.: PCT/EP2020/069258
§ 371 (c)(1),
(2) Date: Jan. 10, 2022

(87) PCT Pub. No.: WO2021/005112
PCT Pub. Date: Jan. 14, 2021

(65) Prior Publication Data
US 2022/0376691 A1 Nov. 24, 2022

(30) Foreign Application Priority Data
Jul. 10, 2019 (LU) .................................. LU101307
Oct. 18, 2019 (LU) .................................. LU101450

(51) Int. Cl.
*H03K 17/96* (2006.01)
*B62D 1/04* (2006.01)

(52) U.S. Cl.
CPC ............ *H03K 17/962* (2013.01); *B62D 1/046* (2013.01); *H03K 2217/960755* (2013.01)

(58) Field of Classification Search
CPC ................. H03K 17/96; H03K 17/962; H03K 2217/960755; G01D 5/24; G01D 5/2417;
(Continued)

(56) References Cited

U.S. PATENT DOCUMENTS 8,841,929 B2 * 9/2014 Bennett .................. B62D 1/046
324/705
9,248,837 B2 * 2/2016 Chakravarty ....... B60W 30/143
(Continued)

FOREIGN PATENT DOCUMENTS

| CN | 104303419 A | 1/2015 |
| CN | 105283735 A | 1/2016 |

(Continued)

OTHER PUBLICATIONS

J. R. Smith et al., "Electric Field Sensing for Graphical Interfaces" by published in IEEE Computer Graphics and Applications, 18(3), 1998, pp. 54-60.

(Continued)

*Primary Examiner* — Andrew Joseph Rudy
(74) *Attorney, Agent, or Firm* — Reising Ethington P.C.

(57) ABSTRACT

A method of operating a capacitive sensing device that includes exactly two electrically conductive antenna electrodes, which are placeable in two layers at a vehicle steering wheel rim, and a current measurement circuit for determining complex electric currents in the antenna electrodes. The method includes at least the following steps for constituting a measurement cycle: operating each one of the exactly two antenna electrodes in loading mode and determine the complex impedance of the respective antenna electrode; and generating a classification signal that is
(Continued)

indicative of a present scenario, based on a fulfillment of at least one predetermined condition concerning at least one characteristic quantity of the first complex impedance as well as of the second complex impedance.

11 Claims, 4 Drawing Sheets

(58) Field of Classification Search
CPC .... G01R 27/26; G01R 27/2605; B62D 1/046; B62D 1/065; B62D 1/286; B62D 6/08; B62D 15/025; B62D 15/0285
USPC .............................................. 701/36; 324/519
See application file for complete search history.

(56) References Cited

U.S. PATENT DOCUMENTS

| | | | | |
|---|---|---|---|---|
| 9,726,775 | B2* | 8/2017 | Lamesch | G01D 5/24 |
| 9,810,727 | B2* | 11/2017 | Kandler | G01L 1/144 |
| 10,077,064 | B2* | 9/2018 | Iguchi | B62D 1/06 |
| 10,377,011 | B2* | 8/2019 | Obayashi | B24B 9/148 |
| 10,501,107 | B2* | 12/2019 | Bossler | H03K 17/962 |
| 10,800,319 | B2* | 10/2020 | Hong | B60K 35/10 |
| 11,613,293 | B2* | 3/2023 | Sabourin | G01V 3/08 |
| | | | | 324/601 |
| 11,747,503 | B2* | 9/2023 | Menaldo | G01V 3/00 |
| | | | | 324/633 |
| 11,894,841 | B2* | 2/2024 | Hirzmann | B62D 1/06 |
| 11,897,561 | B2* | 2/2024 | Kuenzner | B62D 15/0285 |
| 2012/0326735 | A1 | 12/2012 | Bennett | |
| 2014/0224040 | A1 | 8/2014 | Van'tZelfde et al. | |
| 2015/0004884 | A1 | 1/2015 | Obayashi | |
| 2015/0035549 | A1 | 2/2015 | Sugiura | |
| 2015/0048845 | A1 | 2/2015 | Petereit et al. | |
| 2016/0306061 | A1 | 10/2016 | Lamesch | |
| 2017/0166236 | A1 | 6/2017 | Iguchi et al. | |
| 2018/0032200 | A1 | 2/2018 | Hong et al. | |
| 2021/0270637 | A1 | 9/2021 | Sabourin | |
| 2022/0200594 | A1* | 6/2022 | Faber | H03K 17/955 |

FOREIGN PATENT DOCUMENTS

| | | | |
|---|---|---|---|
| CN | 107107939 A | 8/2017 | |
| DE | 20309603 U1 | 9/2003 | |
| EP | 1012530 B1 * | 12/2002 | B60N 2/002 |
| EP | 2833551 A1 | 2/2015 | |
| EP | B103701 A1 | 12/2016 | |
| FR | 3065294 A1 | 10/2018 | |
| JP | 2014019355 A | 2/2014 | |
| JP | 2014190856 A | 10/2014 | |
| WO | 2013117719 A1 | 8/2013 | |
| WO | 2014079735 A1 | 5/2014 | |
| WO | 2014166780 A1 | 10/2014 | |
| WO | 2016071416 A1 | 5/2016 | |

OTHER PUBLICATIONS

International Search Report corresponding to International Application No. PCT/EP2020/069258, dated Sep. 11, 2020, 6 pages.
Written Opinion corresponding to International Application No. PCT/EP2020/069258, dated Sep. 11, 2020, 12 pages.
Chinese Examination Report corresponding to Chinese application 202080050062.7, dated Apr. 15, 2023, 7 pages.

* cited by examiner

DEVICE AND METHOD FOR DETECTING A HAND GRASP WITH A TWO-ZONE SENSOR IN THE STEERING WHEEL

TECHNICAL FIELD

The invention relates to a method of operating a capacitive sensing device that includes two electrically conductive antenna electrodes, a capacitive sensing device two electrically conductive antenna electrodes for capacitive hands off detection at a vehicle steering wheel using such method, a vehicle steering wheel with capacitive hands off detection employing such capacitive sensing device and a software module for carrying out such method.

BACKGROUND

Capacitive sensors and capacitive measurement and/or detection devices employing capacitive sensors have a wide range of applications, and are among others used for the detection of the presence and/or the position of a conductive body or body portion in the vicinity of an antenna electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

In the field of automotive vehicle sensor application it is known to employ capacitive sensors in vehicle seat occupant sensing systems for providing input to a driver or passenger detection system, for instance for the purpose of a seat belt reminder (SBR) system or an activation control for an auxiliary restraint system (ARS). Sensed signals can serve as a basis for making decisions by an ECU, for instance for a decision to deploy an air bag system to a specific vehicle seat or not.

An important example for the use of capacitive sensors in an automotive vehicle application is the so-called Hands off Detection (HoD) system, in which one or more sensors provide information about whether a driver has his hands on a steering wheel of a vehicle or not. This information can be transferred to an Automatic Driver Assistance Systems (ADAS) such as an Adaptive Cruise Control (ACC), which, based on the provided sensor signal, can alert the driver and remind him or her to take control of the steering wheel again. In particular, such HoD systems can be used in support to fulfill a requirement of the Vienna convention that the driver must remain in control of the vehicle at all times. HoD systems may as well be employed in a parking assistance system or an ADAS that is configured for evaluating a driver activity at high speed.

In some (so-called "loading mode") capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "Electric Field Sensing for Graphical Interfaces" by J. R. Smith et al., published in IEEE Computer Graphics and Applications, 18(3): 54-60, 1998, which shall hereby be incorporated by reference in its entirety with effect for the jurisdictions permitting incorporation by reference.

The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may, for instance, be determined by applying an alternating voltage signal to an antenna electrode and by measuring the current flowing from that antenna electrode either towards ground (in the loading mode) or into a second antenna electrode (in the coupling mode). This current may be measured by a transimpedance amplifier (TIA), which is connected to the sensing electrode and which converts the current flowing into the sensing electrode into a voltage proportional to this current.

U.S. Pat. No. 8,841,929 B2 discloses a capacitive sensor device that is integrated in a vehicle steering wheel. The sensor comprises three separate capacitive sensor zones that are configured to detect a driver's hands proximity to a predefined area of the steering wheel. The capacitive sensor zones may be located on the steering wheel surface for detecting a driver's hands at, on and/or around the steering wheel and for assigning the detection result a steering wheel holding position class such as "no hand touching", "hand touching" or "hands grasping".

The hand grasp detection may for instance be used in cars with an autonomous driving feature for identifying a driver's presence and hand pose during driving. Detecting a grasped hand on the steering wheel is safety-related in such automated driving assistance systems, as control is returned to the driver only in case the hands probably grasped the steering wheel.

The complexity of a capacitive sensor device including three or more separate capacitive sensor zones is of a level that is not affordable in every intended application.

SUMMARY

It is therefore an object of the invention to provide a capacitive sensor device with low hardware complexity that is capable of detecting steering wheel holding positions with properly grasped hands in a reliable manner.

In one aspect of the present invention, the object is achieved by a method of operating a capacitive sensing device that includes two electrically conductive antenna electrodes, which are placeable in two layers at a vehicle steering wheel rim. The two electrically conductive antenna electrodes are preferably arranged on or at the steering wheel rim in a way that a grasping hand activates two zones. The layers are e.g. disposed in a spaced manner in a direction that is aligned to pierce the layers, and each antenna electrode at least largely runs all around the rim. The capacitive sensing device further at least comprises a current measurement circuit for determining complex electric currents in the antenna electrodes in response to a provided alternating measurement voltage.

The method in accordance with an aspect of the invention comprises at least the following steps for constituting a measurement cycle:
   select one antenna electrode of the two antenna electrodes as a first antenna electrode,
   provide an alternating measurement voltage to the first antenna electrode,
   determine a first complex electric current flowing through the first antenna electrode,
   calculate a first complex impedance of the first antenna electrode using the first complex electric current,
   select the other antenna electrode of the two antenna electrodes as a second antenna electrode,
   provide the alternating measurement voltage to the second antenna electrode, determine a second complex electric current flowing through the second antenna electrode,
   calculate a second complex impedance of the second antenna electrode using the second complex electric current, and
   generate a classification signal that is indicative of a present scenario, based on a fulfillment of at least one predetermined condition concerning at least one characteristic quantity of the first complex impedance as well as of the second complex impedance.

It is noted that the term "impedance" is used throughout this application in the meaning of an electrical impedance only. It is further noted herewith that the terms "first", "second", etc. are used in this application for distinction purposes only, and are not meant to indicate or anticipate a sequence or a priority in any way.

It is an insight relating to the present invention that a capacitive sensing device that includes exactly just two electrically conductive antenna electrodes can provide a sufficient capability of detecting steering wheel holding positions with properly grasped hands in a reliable manner. This can be achieved if a classification is not based on an individual, independent evaluation of the at least one characteristic quantity of the complex impedances of the two antenna electrodes in a given specific measurement scenario, but is rather based on a combined evaluation, by using the at least one predetermined condition concerning the at least one characteristic quantity of the first complex impedance as well as the second complex impedance.

Preferably, the classification signal can be selected from, without being limited to, a group of classes including "not touching the wheel", "touching the wheel", "one hand grasps wheel" and "both hands grasp wheel".

As will be readily acknowledged by those skilled in the art, the proposed measurement cycle at least includes operating each one of the two antenna electrodes of the capacitive sensing device in loading mode, one at a time, in which case the alternating measurement voltage is solely applied to the first antenna electrode resp. to the second antenna electrode in the different steps, or both at the same time, in which the alternating measurement voltage is simultaneously applied to both antenna electrodes.

In preferred embodiments, the method further comprises at least the following steps for constituting a measurement cycle:
   select one antenna electrode of the two antenna electrodes as a first antenna electrode,
   provide the alternating measurement voltage solely to the first antenna electrode,
   determine a third complex electric current flowing through the other antenna electrode of the two antenna electrodes, and
   calculate a third complex impedance of the coupling between the exactly two antenna electrodes using the third complex electric current.

Further, the step of generating a classification signal is based on a fulfillment of at least one predetermined condition concerning at least one characteristic quantity of the first complex impedance, of the second complex impedance and of the third complex impedance.

As will be readily recognized by those skilled in the art, the proposed measurement cycle additionally includes operating the two antenna electrodes of the capacitive sensing device in coupling mode.

By that, further independent information can be acquired in a given specific measurement scenario. The independent information can be exploited to increase the level of certainty for the step of generating a classification signal and, by that, to achieve a higher reliability for detection of failures or cases of misuse. The higher certainty results from the plurality of input signals used to detect a grasp hand. A single failure event cannot lead to a faulty 'grasp' hand detection.

Preferably, the step of generating a classification signal comprises:
   comparing the characteristic quantity of the first complex impedance with a plurality of threshold values regarding the characteristic quantity of the first complex impedance,
   comparing the characteristic quantity of the second complex impedance with a plurality of threshold values regarding the characteristic quantity of the second complex impedance, and, if applicable,
   comparing the characteristic quantity of the third complex impedance with at least one threshold value regarding the characteristic quantity of the third complex impedance.

The term "plurality", as used in this application, shall be understood to express a quantity of two or more. In this way, a graded and reliable classification can be achieved by the step of generating a classification signal.

In preferred embodiments of the method, the step of generating a classification signal comprises comparing the characteristic quantity of the first complex impedance and the characteristic quantity of the second complex impedance with at least one set of threshold values, which has been obtained by an interpolation between two 2-tuples. Each 2-tuple consists of one of the threshold values regarding the characteristic quantity of the first complex impedance and one of the threshold values regarding the characteristic quantity of the second complex impedance. By that, an improved class separation for a graded and reliable classification can be achieved for the step of generating a classification signal.

Preferably, the type of interpolation is linear, parabolic, circular or hyperbolic. By using one of these types of interpolation, the step of generating a classification signal can be carried out in a fast manner using one or more than one closed formula.

In another aspect of the invention, a capacitive sensing device for capacitive hands off detection at a vehicle steering wheel is provided. The capacitive sensing device comprises two electrically conductive antenna electrodes and a capacitive measurement circuit. The capacitive measurement circuit includes:
- a measurement signal voltage source that is configured for providing an alternating measurement voltage at a voltage output port,
- a remotely controllable switching unit that includes at least four ports and a plurality of switching members that are configured to operatively and selectively provide electrical connections between selected ports, and
- a current measurement circuit that is operatively connected to one of the ports of the switching unit.

The voltage output port is operatively connected to another port of the switching unit. Each one of the exactly two antenna electrodes is connected to a distinct port of the switching unit. The switching unit is at least configured, by being controlled, to selectively connect, within a same measurement cycle, the exactly two antenna electrodes, one at a time or both together, to the voltage output port and the current measurement circuit.

The proposed capacitive sensing device further comprises a signal processing unit and an electronic control unit. The signal processing unit is configured for receiving output signals from the current measurement circuit and for calculating complex impedances from the received output signals. The electronic control unit is at least configured for automatically controlling the switching unit and for carrying out the steps of an embodiment of the method of operation disclosed afore.

The phrases "configured for" and "configured to", as used in this application, shall in particular be understood as being specifically programmed, laid out, furnished or arranged.

In this way, the remotely controllable switching unit can be configured to provide the electrical connections that are required for operating each one of the two antenna electrodes in loading mode, one at a time or simultaneously.

The switching unit can further be configured to provide the electrical connections that are required for operating a first one of the exactly two antenna electrodes and a second one of the exactly two antenna electrodes in coupling mode. In this case, the first antenna electrode is connected to the voltage output port to serve as a transmitting antenna electrode and the second antenna electrode serves as a receiving antenna electrode and is connected to the current measurement circuit.

In this way, the benefits described in context with the disclosed method of operating the capacitive sensing device applied to the proposed capacitive sensing device to the full extent.

In preferred embodiments of the capacitive sensing device, the electronic control unit is formed by a microcontroller that includes a digital data memory unit, a processor unit with data access to the digital data memory unit, and a control interface. Such equipped microcontrollers are commercially available nowadays in many variations and at economic prices. In this way, an automated operation of the capacitive sensing device can be enabled.

Usually, the microcontroller may include a microcontroller system clock for exact timing during automatic operation of the capacitive sensing device.

Preferably, the control interface is designed as a CAN (Controller Area Network) interface, which has the advantage of being compatible to existing automotive standards.

Preferably, the electronic control unit is configured to control the switching unit periodically into the plurality of different switching states constituting the measurement cycle. A periodic time can easily be adjusted to meet any requirements regarding a dynamic behavior of the capacitive sensing device.

In preferred embodiments of the capacitive sensing system, the remotely controllable switching unit is configured to be controlled by a switch remote control unit that forms part of the electronic control unit. In this way, short electrical switching pathways can be achieved, which are less susceptible to electromagnetic interference.

Preferably, the exactly two electrically conductive antenna electrodes are placeable in two layers at a rim of a vehicle steering wheel, wherein the layers are disposed in a spaced manner in a direction that is aligned to pierce the layers, and each antenna electrode at least largely runs all around the rim. The specific embodiment is particularly suitable for being employed in a capacitive sensing device for capacitive hands off detection of vehicle steering wheel.

The term "at least largely", as used in this application, shall particularly be understood as equal to or more than 50%, more preferably more than 70%, and, most preferably, more than 80% in an angular direction of the steering wheel, and shall encompass a portion of close to 100%, i.e. the respective antenna electrode runs almost completely around the steering wheel rim.

Preferably, the direction in which the layers are disposed in a spaced manner is aligned perpendicular to the layers.

The direction in which the layers are disposed in a spaced manner may run in parallel with a vehicle forward driving direction, i.e. one of the exactly two antenna electrodes is arranged to face the driver, while the other of the exactly two antenna electrodes is arranged to face the vehicle dashboard.

In other embodiments, the direction in which the layers are disposed in a spaced manner may be a radial direction with regard to a center of the steering wheel, such that one of the exactly two antenna electrodes is arranged to at least largely run around an inner circumference of the rim, while the other of the exactly two antenna electrodes is arranged to at least largely run around an outer circumference of the rim.

In yet another aspect of the invention, a vehicle steering wheel with capacitive hands off detection is proposed. The vehicle steering wheel comprises a capacitive sensing device as disclosed herein. In this way, a vehicle steering wheel with capacitive hands off detection of low hardware complexity can be provided with a sufficient capability of detecting steering wheel holding positions with properly grasped hands in a reliable manner.

In yet another aspect of the invention, a software module for controlling an automatic execution of steps of an embodiment of the method disclosed herein is provided.

The method steps to be conducted are converted into a program code of the software module, wherein the program code is implementable in a digital data memory unit of the capacitive sensing device disclosed herein and is executable by a processor unit of the capacitive sensing device. Preferably, the digital data memory unit and/or processor unit may be a digital data memory unit and/or a processing unit of the electronic control unit of the capacitive sensing device. The processor unit may, alternatively or supplementary, be another processor unit that is especially assigned to execute at least some of the method steps.

The software module can enable a robust and reliable execution of the method and can allow for a fast modification of method steps.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies one or more embodiments of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
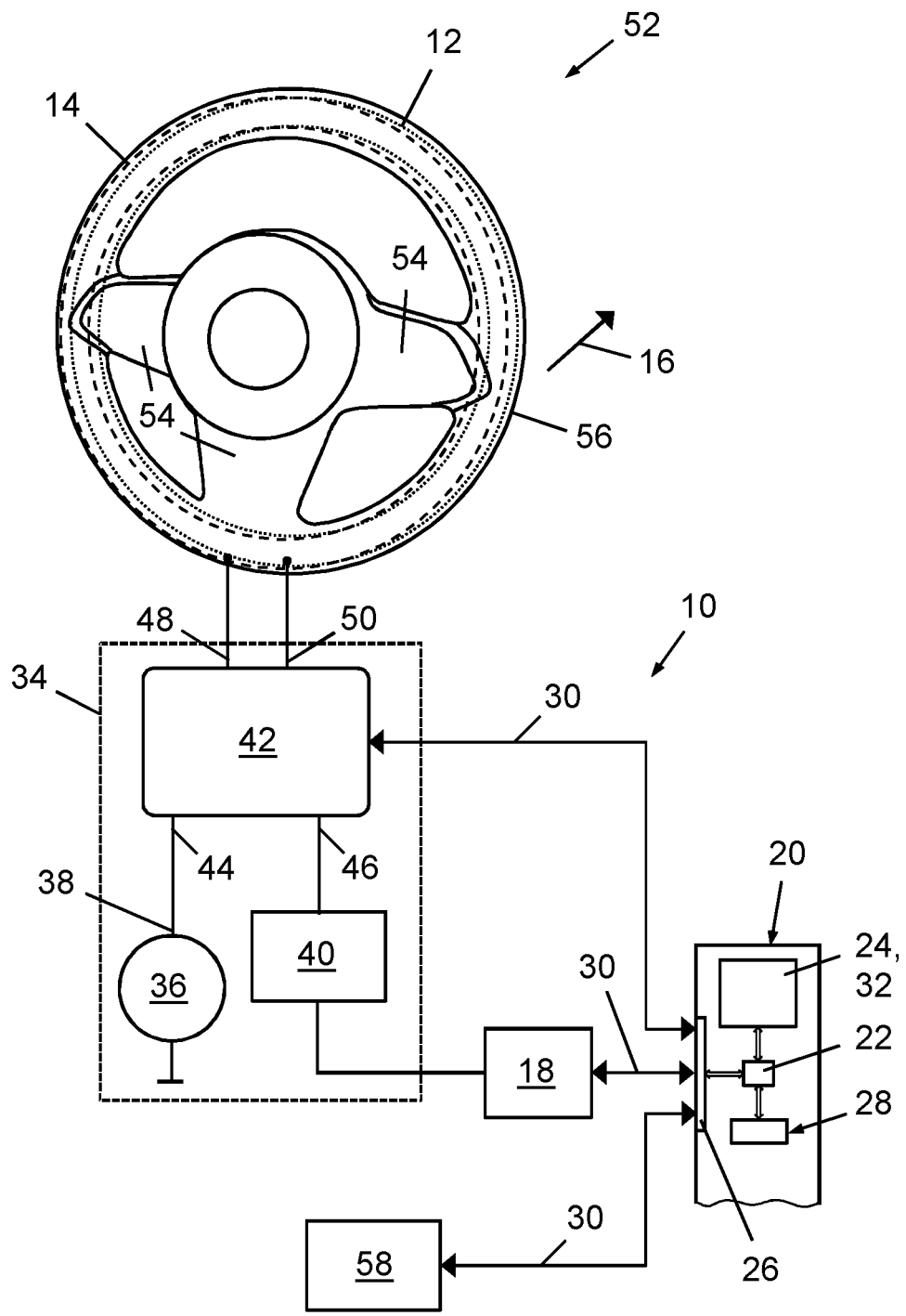
FIG. 1 schematically illustrates a vehicle steering wheel with capacitive hands off detection, comprising a capacitive sensing device in accordance with an embodiment of the invention.

FIG. 1 schematically illustrates a vehicle steering wheel 52 with capacitive hands off detection (HoD), comprising a capacitive sensing device 10 in accordance with an embodiment of the invention. The vehicle is designed as a passenger car. The vehicle steering wheel 52 comprises three spokes 54 connected to an outer rim 56. The capacitive sensing device 10 includes exactly two electrically conductive antenna electrodes 12, 14, which are placed in two layers at the outer rim 56 of the vehicle steering wheel 52.

A first antenna electrode 12 of the exactly two antenna electrodes 12, 14 is designed as a circular ring (dotted lines) and is circumferentially arranged at a rear surface, which is facing the dashboard, along the outer rim 56 of the vehicle steering wheel 52. A second antenna electrode 14 of the exactly two antenna electrodes 12, 14 is circumferentially arranged at a front surface, which is facing the driver, of the outer rim 56 of the steering wheel 52. In this way, the antenna electrodes 12, 14 are arranged in two layers. The layers are disposed in a spaced manner in a direction 16 that is aligned to pierce the layers and is particularly arranged perpendicular to the layers, and each one of the exactly two antenna electrodes 12, 14 largely runs all around the rim 56.

The antenna electrodes 12, 14 may be formed as printed metal electrodes attached on a flexible film carrier, as is known in the art. Except for electrical connections to be described below that are deliberately provided by a capacitive measurement circuit 34, the antenna electrodes 12, 14 are mutually galvanically separated from each other.

The vehicle steering wheel 52 comprises a leather trim (not shown) that covers most part of the outer rim 56 and hides and protects the antenna electrodes 12, 14 from external influences. The exactly two antenna electrodes 12, 14 have a width designed to cover a major amount of an outer surface of the outer rim 56 of the vehicle steering wheel 52.

The capacitive sensing device 10 comprises a capacitive measurement circuit 34 for determining complex electric currents. The capacitive measurement circuit 34 includes a measurement signal voltage source 36 that is configured for providing an alternating measurement voltage at a voltage output port 38. The capacitive measurement circuit 34 also comprises a current measurement circuit 40 including current measurement means.

The current measurement means may include one or more transimpedance amplifiers (TIA), whose function is to convert a complex current into an output voltage that is proportional to the determined current. The current measurement means may alternatively include analog-to-digital converters connected in parallel to an impedance of an a priori known value. In principle, any other current measurement means that appear suitable for those skilled in the art may be employed.

The capacitive measurement circuit 34 is configured for determining complex electric currents in the antenna electrodes 12, 14 in response to a provided alternating measurement voltage and for determining a complex impedance of an unknown capacitance from the determined complex current and the provided alternating measurement voltage. The unknown complex impedance represents a position of an object relative to one of the antenna electrodes 12, 14.

In this specific embodiment, the alternating measurement signal is formed as a periodic electrical measurement voltage, namely a sinusoidal measurement voltage. Also, the periodic electrical measurement voltage has a fundamental frequency of about 15 MHz. In other possible embodiments, the alternating measurement signal generator may be configured to generate an alternating electrical measurement signal of different signal shape, such as a square waveform, and/or at a different fundamental frequency.

Furthermore, the capacitive measurement circuit 34 comprises a remotely controllable switching unit 42. The switching unit 42 includes a plurality of four ports 44-50 and a plurality of switching members that are configured to operatively and selectively provide electrical connections between selected ports 44-50.

The switching members of the switching unit 42 may for instance be designed as semiconductor switches such as MOSFETs (metal-oxide-semiconductor field-effect transistor). Any other switching member that appears suitable to those skilled in the art may as well be used.

The voltage output port 38 of the measurement signal voltage source 36 is electrically connected to one port 44 of the plurality of four ports 44-50 of the switching unit 42. The current measurement circuit 40 is operatively connected to another port 46 of the plurality of ports 44-50 of the switching unit 42. Each one of the exactly two antenna electrodes 12, 14 is individually connected to another distinct port 48, 50 of the switching unit 42.

By being controlled, the switching unit 42 is configured to selectively connect, within a same measurement cycle, the exactly two antenna electrodes 12, 14, one at a time, to the voltage output port 38 and to the current measurement circuit 40. At another point in time of the same measurement cycle, the switching unit 42 is configured to selectively connect, by being controlled, a first one of the antenna electrodes 12, 14 to the voltage output port 38 and a second one of the antenna electrodes 12, 14 to the current measurement circuit 40.

Moreover, the capacitive sensing device 10 comprises a signal processing unit 18 that is configured for receiving output signals from the current measurement circuit 40 and for calculating complex impedances from the received output signals.

The capacitive sensing device 10 also includes an electronic control unit 20. The electronic control unit 20 is formed by a microcontroller that includes a digital data memory unit 24, a processor unit 22 with data access to the digital data memory unit 24 and a control interface 26. The capacitive sensing device 10 comprises a switch remote control unit 28 that is an integral part of the microprocessor. The control interface 26 may be designed as a CAN (Controller Area Network) interface.

The electronic control unit 20 is connected to the signal processing unit 18 for receiving data signals representing complex impedances that have been determined from output signals provided by the capacitive measurement circuit 34. The electronic control unit 20 is further configured for automatically controlling the switching unit 42 via the switch remote control unit 28, and for evaluating the complex impedances received from the signal processing unit 18 during a measurement cycle. Appropriate control/data lines 30 are established.

The capacitive measurement circuit 34 and the electronic control unit 20 are installed in the vehicle, remote from the vehicle steering wheel 52. The electronic control unit 20 is data-linked with an ADAS 58 of the vehicle.

In the following, an embodiment of a method of operating the capacitive sensing device 10 pursuant to FIG. 1 will be described with reference to FIG. 1, 2 and FIGS. 3a, 3b, in which a flowchart of the method is provided. In preparation of operating the capacitive sensing device 10, it shall be understood that all involved units and devices are in an operational state and configured as illustrated in FIG. 1.

In order to be able to automatically and periodically carry out the method, the electronic control unit 20 comprises a software module 32 (FIG. 1). The method steps to be conducted are converted into a program code of the software module 32. The program code is implemented in the digital data memory unit 24 of the electronic control unit 20 and is executable by the processor unit 22 of the electronic control unit 20. Alternatively, the software module 32 may as well reside in and may be executable by another control unit of the vehicle, and established data communication means between the electronic control unit 20 and the vehicle control unit would be used for enabling mutual data transfer.

The following steps constitute a measurement cycle. The electronic control unit 20 is configured to control an automatic repetition of the measurement cycle in a periodic manner.

In a first step 70 of the method, one antenna electrode 12 of the exactly two antenna electrodes 12, 14 is selected as a first antenna electrode. In another step 72, the switching unit 42 is controlled to selectively connect solely the first antenna electrode 12 to the voltage output port 38 to provide the alternating measurement voltage and to the current measurement circuit 40 for loading mode operation of the first antenna electrode 12. To this end, a first complex current flowing through the first antenna electrode 12 is determined by the current measurement circuit 40 in response to the measurement voltage in another step 74. Then, in a next step 76, an output signal from the current measurement circuit 40 that represents the measured first complex current is received by the signal processing unit 18, which calculates a first complex impedance of the first antenna electrode using the first complex electric current in another step 78. In a subsequent step 80, the first complex impedance is stored in the digital data memory unit 24 of the electronic control unit 20.

In another step 82 of the method, the other antenna electrode 14 of the exactly two antenna electrodes 12, 14 is selected as a second antenna electrode. In one step 84, the switching unit 42 is controlled to selectively connect solely the second antenna electrode 14 to the voltage output port 38 to provide the alternating measurement voltage and to the current measurement circuit 40 for loading mode operation of the second antenna electrode 14. To this end, a second complex current flowing through the second antenna electrode 14 is determined by the current measurement circuit 40 in response to the measurement voltage in another step 86. Then, in a next step 88, an output signal from the current measurement circuit 40 that represents the measured second complex current is received by the signal processing unit 18, which calculates a second complex impedance of the second antenna electrode 14 using the second complex electric current in another step 90. In a subsequent step 92, the second complex impedance is stored in the digital data memory unit 24 of the electronic control unit 20.

In a further step 94 of the method, the stored first complex impedance and second complex impedance are retrieved from the digital data memory unit 24. Then, in another step 96, the stored first complex impedance and second complex impedance are evaluated and a classification signal is generated based on the fulfillment of predetermined conditions concerning a characteristic quantity of the first complex impedance as well as of the second complex impedance.

Figure 2:
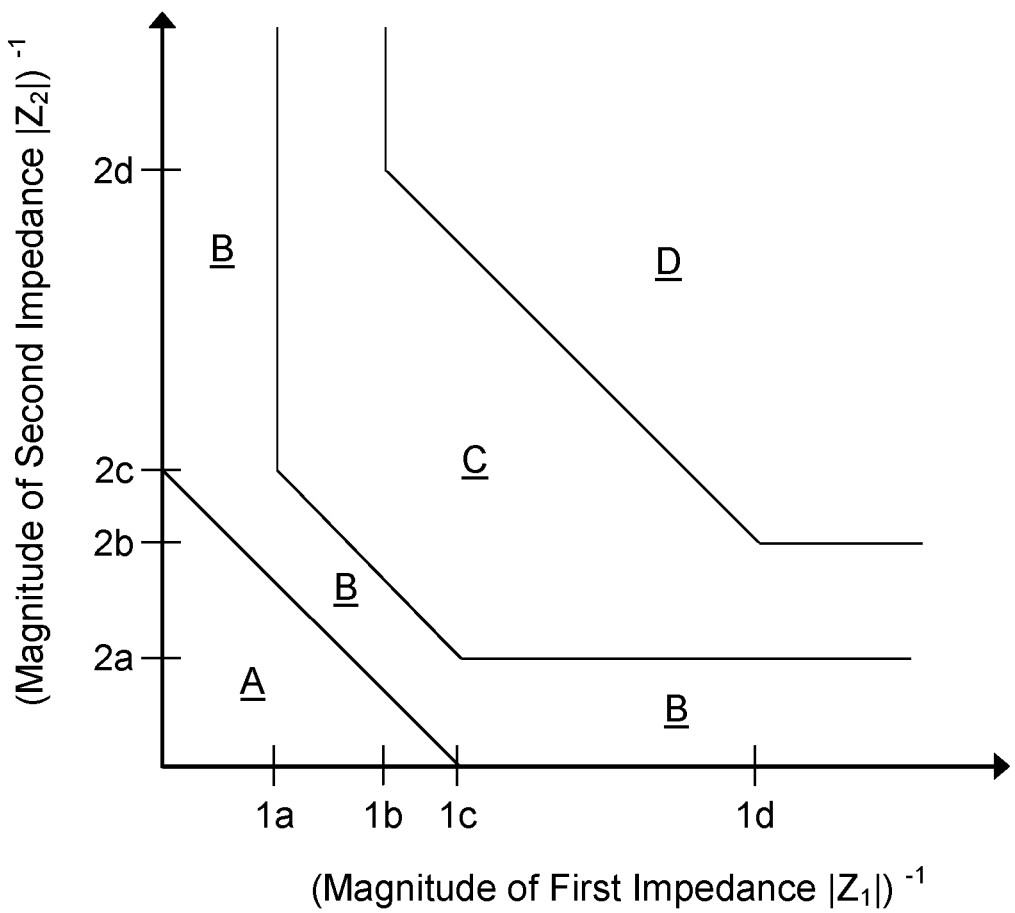
FIG. 2 is an illustration of predetermined conditions concerning a characteristic quantity of a determined first complex impedance and of the second complex impedance.

FIG. 2 is an illustration of the predetermined conditions, in a 2D representation, concerning a characteristic quantity of a determined first complex impedance and of the second complex impedance. The characteristic quantity is selected to be the inverse of the magnitude of the respective complex impedance. The 2D representation is a Cartesian coordinate system with the inverse of the magnitude of the first complex impedance as the abscissa, and the inverse of the magnitude of the second complex impedance as the ordinate. In a transition from a steering wheel holding position in which the driver's hands hardly touch the steering wheel to a steering wheel holding position with properly grasped hands, a magnitude of the complex electric current flowing through the first antenna electrode 12 and the second antenna electrode 14, respectively, increases in the loading mode operation. The complex electric current is proportional to the inverse of the magnitude of the complex impedance.

In the 2D representation, the predetermined conditions are illustrated by specific regions that corresponds to specific steering wheel holding position classes for the classification of a present scenario.

The steering wheel holding position classes are chosen as:
A—"no hand touching",
B—"hand touching",
C—"one hand grasping", and
D—"both hands grasping".

The classes A, B, C, D or regions are separated by lines that are defined by a plurality of predefined threshold values $1a$-$1d$ regarding the characteristic quantity of the first complex impedance, by a plurality of predefined threshold values $2a$-$2d$ regarding the characteristic quantity of the second complex impedance, and by sets of threshold values obtained by interpolation. In this specific embodiment, each interpolation is of the linear type and is carried out between two 2-tuples. In other embodiments the employed interpolation method may be of a parabolic, circular or hyperbolic type. Each 2-tuple consists of one of the threshold values 1a-1d regarding the characteristic quantity of the first complex impedance and one of the threshold values 2a-2d regarding the characteristic quantity of the second complex impedance.

For instance, the classes A ("no hand touching") and B ("hands touching") are separated by a set of threshold values obtained by linear interpolation between a first 2-tuple consisting of the value zero for the characteristic quantity of the first complex impedance and the predefined threshold value 2c regarding the characteristic quantity of the second complex impedance, and a second 2-tuple consisting of the predefined threshold value 1c for the characteristic quantity of the first complex impedance and the value zero for the characteristic quantity of the second complex impedance. In order to avoid ambiguities, the set of threshold values, represented in FIG. 2 by a straight line, may be embedded in a safety zone defined by safety margins for each threshold value of the plurality of threshold values.

Further, the classes B ("hands touching") and C ("one hand grasping") are separated by the predefined threshold value 1a regarding the characteristic quantity of the first complex impedance, by the predefined threshold value 2a regarding the characteristic quantity of the second complex impedance, and a set of threshold values obtained by linear interpolation between a first 2-tuple consisting of the predefined threshold value 1a regarding the characteristic quantity of the first complex impedance and the predefined threshold value 2c regarding the characteristic quantity of the second complex impedance, and a second 2-tuple consisting of the predefined threshold value 1c for the characteristic quantity of the first complex impedance and the predefined threshold value 2a for the characteristic quantity of the second complex impedance.

In other words, for obtaining the steering wheel holding position class C ("one hand grasping") in the step 96 of generating a classification signal, for instance, the characteristic quantity of the first complex impedance has to exceed the predefined threshold value 1a, and the characteristic quantity of the second complex impedance has to exceed the predefined threshold value 2a at least by an amount that is dependent on the characteristic quantity of the first complex impedance determined at present.

Thus, the step 96 of generating a classification signal comprises comparing the characteristic quantity of the first complex impedance with a plurality of threshold values 1a-1d regarding the characteristic quantity of the first complex impedance, comparing the characteristic quantity of the second complex impedance with a plurality of threshold values 2a-2d regarding the characteristic quantity of the second complex impedance, and comparing the characteristic quantity of the first complex impedance and the characteristic quantity of the second complex impedance with a plurality of sets of threshold values obtained by an interpolation between threshold values 1a-1d regarding the characteristic quantity of the first complex impedance and threshold values 2a-2d regarding the characteristic quantity of the second complex impedance.

In this way, based on a fulfillment of the described predetermined conditions illustrated by FIG. 2, the classification signal that is indicative of a present scenario is generated by the electronic control unit 20 in step 96.

Figure 3A:
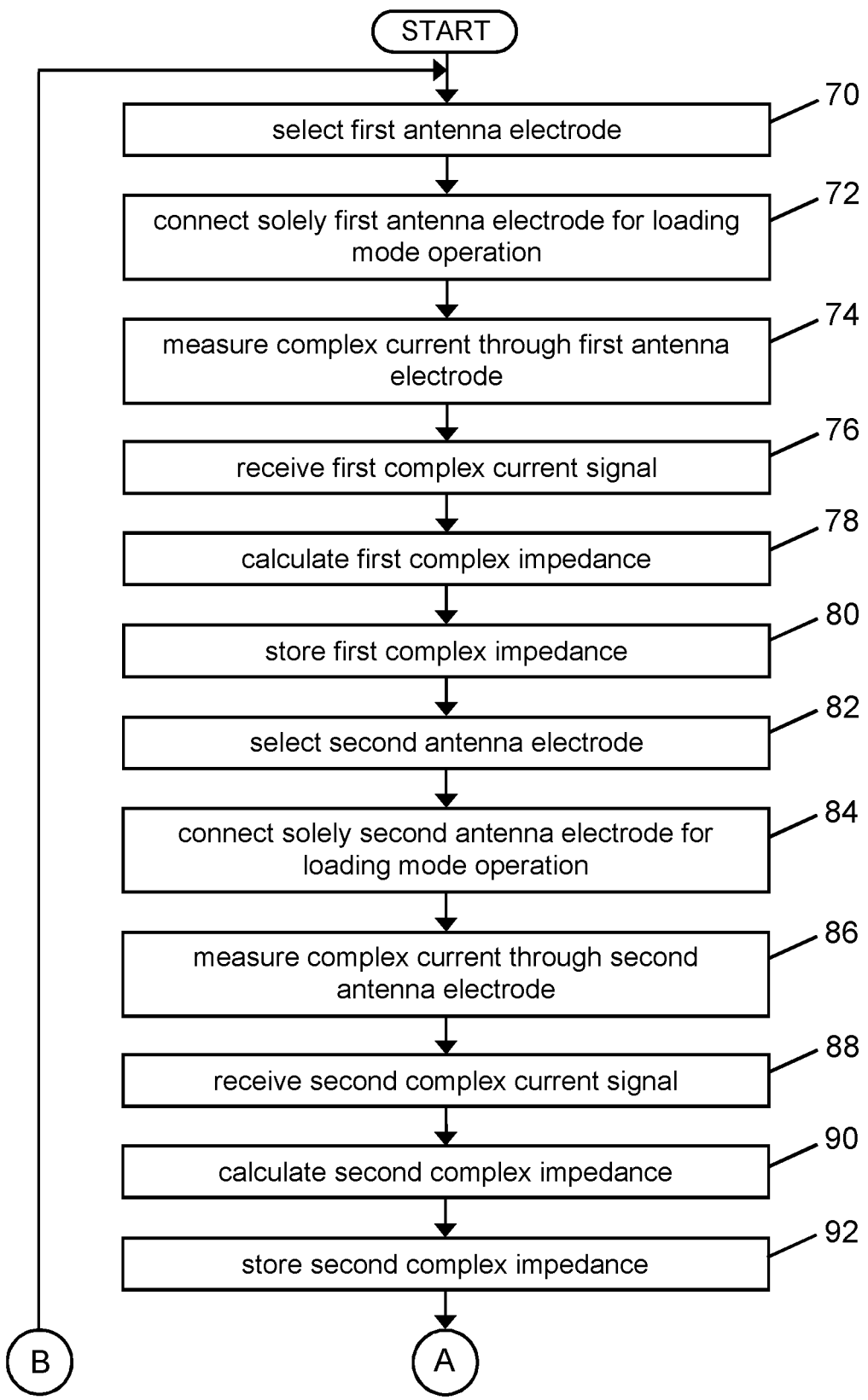
FIGS. 3a, 3b show a flow chart of a method of operating the capacitive sensing device pursuant to FIG. 1.
Figure 3B:
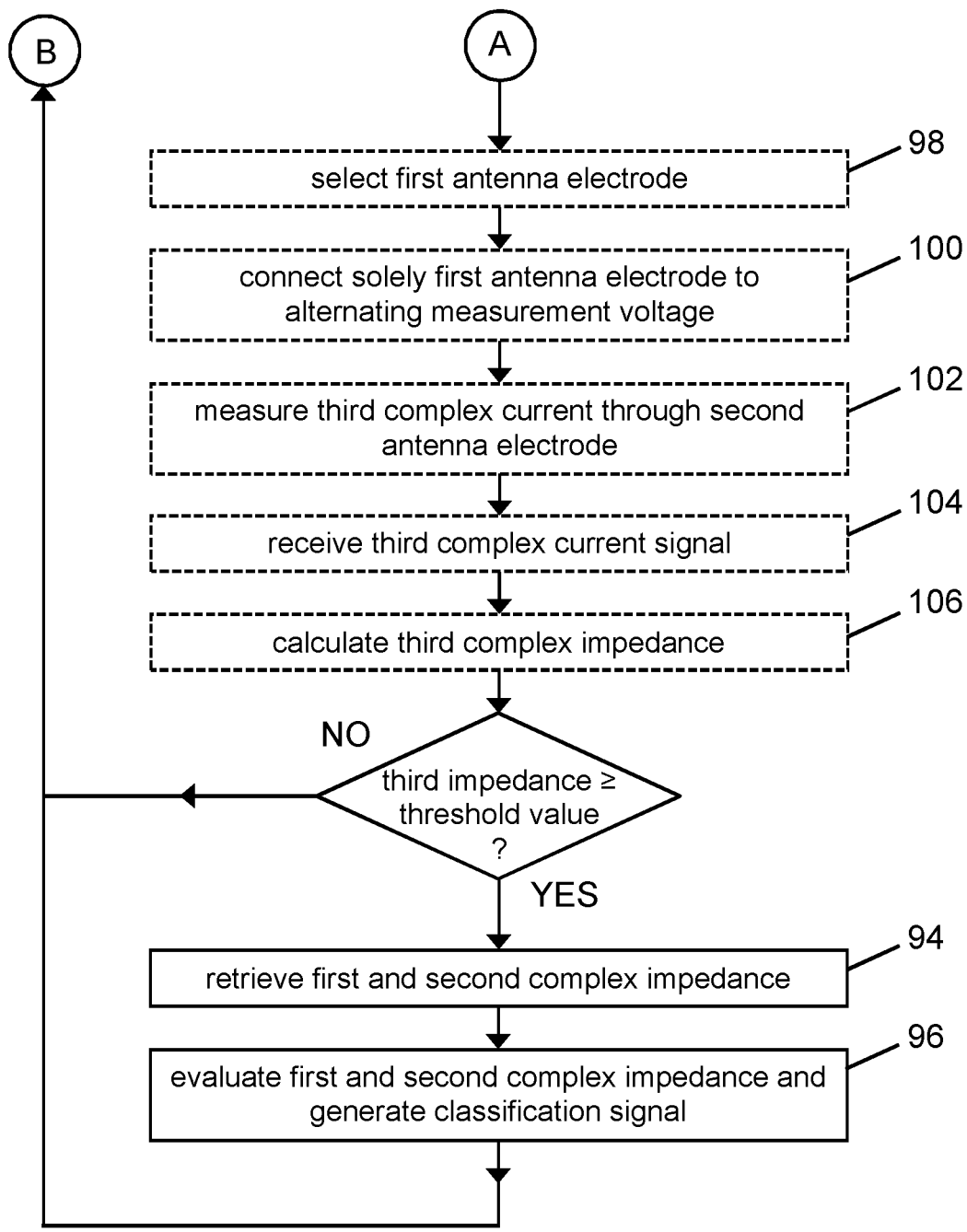

An alternative embodiment of the method may include further steps as an additional safety option, preceding the step 96 of generating a classification signal. These steps are shown in FIG. 3b with dashed line boxes. In one of these steps 98, one antenna electrode 12 of the exactly two antenna electrodes 12, 14 is selected as a first antenna electrode. In the following step 100, the alternating measurement voltage is provided solely to the first antenna electrode. Then, in another step 102, a third complex electric current flowing through the other antenna electrode 14 of the exactly two antenna electrodes 12, 14 is measured. Then, in next steps 104, 106, an output signal from the current measurement circuit 40 that represents the measured third complex current is received by the signal processing unit 18, and a third complex impedance of the coupling between the exactly two antenna electrodes 12, 14 using the third complex electric current is calculated.

Another predetermined condition regarding a characteristic quantity of the third complex impedance, which is as well given by an inverse of the magnitude of the complex impedance, has to be fulfilled prior to executing the step 96 of generating a classification signal based on a fulfillment of the predetermined conditions concerning the characteristic quantity of the first complex impedance as well as the second complex impedance. For instance, for each steering wheel holding position class A, B, C, D a respective predefined threshold value may be set up that the inverse of the magnitude of the third complex impedance has to exceed as the predetermined condition. In this way, a plausibility or safety check is implemented. Unless this predetermined condition is fulfilled, the step of generating a classification signal indicative of the class determined by fulfilling the predetermined conditions illustrated in FIG. 2 by the characteristic quantities of the first complex impedance as well as the second complex impedance is prevented. By that, a higher reliability for detection of failures or cases of misuse is achieved.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A method of operating a capacitive sensing device that includes:
    two electrically conductive antenna electrodes, which are placeable in two layers at a vehicle steering wheel rim, wherein the layers are disposed in a spaced manner in a direction that is aligned to pierce the layers and each antenna electrode at least largely runs all around the rim, and
    a current measurement circuit for determining complex electric currents in the antenna electrodes in response to a provided alternating measurement voltage,
    the method comprising at least the following steps for constituting a measurement cycle:
    selecting (70) one antenna electrode of the two antenna electrodes as a first antenna electrode,
    providing (72) an alternating measurement voltage to the first antenna electrode, determining (74) a first complex electric current flowing through the first antenna electrode, calculating (76) a first complex impedance of the first antenna electrode using the first complex electric current, selecting (82) the other antenna electrode of the two antenna electrodes (12, 14) as a second antenna electrode, providing (84) the alternating measurement voltage to the second antenna electrode, determining (86) a second complex electric current flowing through the second antenna electrode, calculating (90) a second complex impedance of the second antenna electrode using the second complex electric current, and generating (96) a classification signal that is indicative of a present scenario, based on a fulfillment of at least one predetermined condition concerning at least one characteristic quantity of the first complex impedance as well as of the second complex impedance.

2. The method as claimed in claim 1, further comprising at least the following steps for constituting a measurement cycle:

selecting (98) one antenna electrode of the two antenna electrodes as a first antenna electrode, providing (100) the alternating measurement voltage solely to the first antenna electrode, determining (102) a third complex electric current flowing through the other antenna electrode of the two antenna electrodes, and calculating (106) a third complex impedance of the coupling between the exactly two antenna electrodes using the third complex electric current, wherein the step of generating (96) a classification signal is based on a fulfillment of at least one predetermined condition concerning at least one characteristic quantity of the first complex impedance, of the second complex impedance and of the third complex impedance.

3. The method as claimed in claim 1, wherein the step of generating (96) a classification signal comprises:

comparing the characteristic quantity of the first complex impedance with a plurality of threshold values regarding the characteristic quantity of the first complex impedance, comparing the characteristic quantity of the second complex impedance with a plurality of threshold values regarding the characteristic quantity of the second complex impedance, and, if applicable, comparing the characteristic quantity of the third complex impedance with at least one threshold value regarding the characteristic quantity of the third complex impedance.

4. The method as claimed in claim 1, wherein the step of generating (96) a classification signal comprises comparing the characteristic quantity of the first complex impedance and the characteristic quantity of the second complex impedance with at least one set of threshold values obtained by an interpolation between two 2-tuples, each 2-tuple consisting of one of the threshold values regarding the characteristic quantity of the first complex impedance and one of the threshold values regarding the characteristic quantity of the second complex impedance.

5. The method as claimed in claim 4, wherein the type of interpolation is linear, parabolic, circular or hyperbolic.

6. A capacitive sensing device for capacitive hands off detection at a vehicle steering wheel, comprising:

exactly two electrically conductive antenna electrodes, and a capacitive measurement circuit including:

a measurement signal voltage source that is configured for providing an alternating measurement voltage at a voltage output port, a remotely controllable switching unit that includes at least four ports and a plurality of switching members that are configured to operatively and selectively provide electrical connections between selected ports, and a current measurement circuit that is operatively connected to one of the ports of the switching unit, wherein the voltage output port is operatively connected to another port of the switching unit, each one of the exactly two antenna electrodes is connected to a distinct port of the switching unit, and the switching unit is at least configured, by being controlled, to selectively connect, within a same measurement cycle, the exactly two antenna electrodes, one at a time, to the voltage output port and the current measurement circuit, a signal processing unit that is configured for receiving output signals from the current measurement circuit and for calculating complex impedances from the received output signals, and an electronic control unit that is at least configured:

for automatically controlling the switching unit, and for carrying out the steps of the method as claimed in claim 1.

7. The capacitive sensing device as claimed in claim 6, wherein the electronic control unit is formed by a microcontroller that includes a digital data memory unit, a processor unit with data access to the digital data memory unit and a control interface.

8. The capacitive sensing device as claimed in claim 6, wherein the remotely controllable switching unit is configured to be controlled by a switch remote control unit that forms part of the electronic control unit.

9. The capacitive sensing device as claimed in claim 6, wherein the exactly two electrically conductive antenna electrodes are placeable in two layers at a rim of a vehicle steering wheel, wherein the layers are disposed in a spaced manner in a direction that is aligned to pierce the layers, and each antenna electrode at least largely runs all around the rim.

10. A vehicle steering wheel with capacitive hands off detection, comprising a capacitive sensing device as claimed in claim 6.

11. A computer-readable medium having stored thereon a software module for controlling an automatic execution of steps of the method as claimed in claim 1, wherein the software module comprises program code that is executable by a processor unit of a capacitive sensing device or of a separate electronic control unit.

\* \* \* \* \*